(12) United States Patent
Sutardja

(10) Patent No.: US 9,236,350 B2
(45) Date of Patent: Jan. 12, 2016

(54) PACKAGING DRAM AND SOC IN AN IC PACKAGE

(71) Applicant: Marvell World Trade LTD., St. Michael (BB)

(72) Inventor: Sehat Sutardja, Los Altos Hills, CA (US)

(73) Assignee: Marvell World Trade LTD., St. Michael (BB)

( * ) Notice: Subject to any disclaimer, the term of this patent is extended or adjusted under 35 U.S.C. 154(b) by 0 days.

(21) Appl. No.: 14/553,185

(22) Filed: Nov. 25, 2014

(65) Prior Publication Data

US 2015/0076687 A1 Mar. 19, 2015

Related U.S. Application Data

(63) Continuation of application No. 13/590,949, filed on Aug. 21, 2012, now Pat. No. 8,896,126.

(60) Provisional application No. 61/526,586, filed on Aug. 23, 2011, provisional application No. 61/548,344, filed on Oct. 18, 2011.

(51) Int. Cl.
*H01L 23/48* (2006.01)
*H01L 23/52* (2006.01)
(Continued)

(52) U.S. Cl.
CPC ............ *H01L 23/5384* (2013.01); *H01L 23/13* (2013.01); *H01L 23/34* (2013.01);
(Continued)

(58) Field of Classification Search
CPC ........... H01L 2224/48227; H01L 2224/73265; H01L 2224/4824; H01L 2224/32145; H01L 2224/97; H01L 2224/48247; H01L 2224/85; H01L 2224/48137; H01L 25/0657; H01L 2225/0651; H01L 2225/1088; H01L 2225/06506; H01L 2225/06558; H01L 2225/1052; H01L 24/49; H01L 24/97; H01L 24/73; H01L 24/85; H01L 2924/19105; H05K 2201/10515; H05K 2201/049; H05K 2201/09954; H05K 2203/049
USPC ......... 257/685, 686, 712, 723, 724, 725, 737, 257/738, 773, 774, 776, 777
See application file for complete search history.

(56) References Cited

U.S. PATENT DOCUMENTS 5,854,507 A 12/1998 Miremadi et al.
6,049,129 A 4/2000 Yew et al.
(Continued)

FOREIGN PATENT DOCUMENTS

KR 20060120365 A 11/2006

OTHER PUBLICATIONS

Carson, Flynn, "Package-on-Package Variations on the Horizon;" STATS ChipPAC Inc., Fremont, CA—Semiconductor International, May 1, 2008; 6 Pages.
(Continued)

*Primary Examiner* — Julio J Maldonado
*Assistant Examiner* — Cory Eskridge

(57) ABSTRACT

An integrated circuit package including a first substrate, a first die, a second die, a second substrate, and a system on chip. The first substrate includes a first portion including first connections, a second portion including no connections, a third portion including second connections, a first opening between the first portion and the second portion, and a second opening between the second portion and the third portion. The first die is arranged on the first substrate. The first die includes third connections to connect to the first connections via the first opening. The second die is arranged adjacent to the first die on the first substrate. The second die includes fourth connections to connect to the second connections via the second opening. The second substrate is connected to the first substrate. The system on chip is arranged on the second substrate between the first substrate and the second substrate.

20 Claims, 5 Drawing Sheets

(51) Int. Cl.
*H01L 29/40* (2006.01)
*H01L 23/538* (2006.01)
*H01L 23/13* (2006.01)
*H01L 23/498* (2006.01)
*H01L 25/18* (2006.01)
*H01L 23/34* (2006.01)
*H01L 27/108* (2006.01)
*H01L 23/00* (2006.01)
*H01L 25/065* (2006.01)
*H01L 25/10* (2006.01)

(52) U.S. Cl.
CPC .......... *H01L23/49838* (2013.01); *H01L 24/73* (2013.01); *H01L 25/18* (2013.01); *H01L 27/108* (2013.01); *H01L 24/16* (2013.01); *H01L 24/48* (2013.01); *H01L 25/0652* (2013.01); *H01L 25/105* (2013.01); *H01L 2224/16225* (2013.01); *H01L 2224/16227* (2013.01); *H01L 2224/32145* (2013.01); *H01L 2224/32225* (2013.01); *H01L 2224/32245* (2013.01); *H01L 2224/4824* (2013.01); *H01L 2224/73207* (2013.01); *H01L 2224/73215* (2013.01); *H01L 2224/73257* (2013.01); *H01L 2224/73265* (2013.01); *H01L 2225/107* (2013.01); *H01L 2225/1023* (2013.01); *H01L 2225/1058* (2013.01); *H01L 2225/1094* (2013.01); *H01L 2924/014* (2013.01); *H01L 2924/14* (2013.01); *H01L 2924/1436* (2013.01); *H01L 2924/15151* (2013.01); *H01L 2924/15153* (2013.01); *H01L 2924/15192* (2013.01); *H01L 2924/15311* (2013.01); *H01L 2924/15321* (2013.01); *H01L 2924/15331* (2013.01); *H01L 2924/30107* (2013.01)

(56) References Cited

U.S. PATENT DOCUMENTS

| | | |
|---|---|---|
| 6,445,594 B1 | 9/2002 | Nakagawa et al. |
| 6,642,610 B2 | 11/2003 | Park et al. |
| 6,917,107 B2 | 7/2005 | Akram |
| 7,061,092 B2 | 6/2006 | Akram et al. |
| 7,190,063 B2 | 3/2007 | Aoyagi |
| 7,368,319 B2 | 5/2008 | Ha et al. |
| 7,432,599 B2 | 10/2008 | Verma et al. |
| 7,518,226 B2 | 4/2009 | Cablao et al. |
| 7,851,899 B2 | 12/2010 | Chen et al. |
| 8,253,231 B2 | 8/2012 | Sutardja |
| 2003/0064547 A1 | 4/2003 | Akram et al. |
| 2006/0110849 A1 | 5/2006 | Lee et al. |
| 2006/0192292 A1 | 8/2006 | Wang et al. |
| 2007/0241441 A1* | 10/2007 | Choi .................. H01L 25/0652 257/686 |
| 2007/0246840 A1 | 10/2007 | Chye et al. |
| 2008/0006948 A1 | 1/2008 | Wu et al. |
| 2008/0303173 A1 | 12/2008 | Hamada et al. |
| 2009/0108425 A1 | 4/2009 | Lee et al. |
| 2010/0295166 A1 | 11/2010 | Kim |
| 2011/0063805 A1 | 3/2011 | Kim |
| 2012/0015481 A1 | 1/2012 | Kim |

OTHER PUBLICATIONS

PCT International Search Report Transmittal for Application No. PCT/US2012/051841, Nov. 29, 2012, 4 Pages.

* cited by examiner

PACKAGING DRAM AND SOC IN AN IC PACKAGE

CROSS-REFERENCE TO RELATED APPLICATIONS

This application is a continuation of U.S. application Ser. No. 13/590,949 (now U.S. Pat. No. 8,896,126), filed on Aug. 21, 2012, which claims the benefit of U.S. Provisional Application No. 61/526,586, filed on Aug. 23, 2011, and U.S. Provisional Application No. 61/548,344, filed on Oct. 18, 2011.

This application is related to U.S. application Ser. No. 12/565,430, filed on Sep. 23, 2009, which claims the benefit of U.S. Provisional Application Nos. 61/099,355, filed on Sep. 23, 2008 and 61/121,018, filed on Dec. 9, 2008.

The disclosures of the above applications are incorporated herein by reference in their entirety.

FIELD

The present disclosure relates generally to integrated circuits and more particularly to packaging dynamic random access memory (DRAM) and a system-on-chip (SOC) in a single integrated circuit (IC) package.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

The dynamic random access memory (DRAM) industry has been trying to resolve issues related to high-performance DRAM that is used in high-end application processors such as smartphone or tablet processors. Today the industry is using low-power (LP) double-data-rate (DDR) DRAM such as LP-DDR2 and DDR3 DRAM. Throughout the present disclosure, the term DDR or DDRx, where x is an integer greater than or equal to 1, will be used to denote DDR DRAM or DDRx DRAM, respectively. The abbreviation DRAM will be omitted to improve readability.

The Joint Electron Devices Engineering Council (JEDEC) is presently discussing LP-DDR3 and DDR4 as well as ultra-wide I/O DRAM. Ultra-wide I/O DRAM is supposed to address bandwidth challenge but at the expense of requiring expensive through-silicon via (TSV) technology. In addition to the cost, for each generation of ultra-wide I/O DRAM, the customers would need to redesign the TSV and/or the system-on-chip (SOC) utilizing the ultra-wide I/O DRAM.

SUMMARY

An integrated circuit package comprises a first memory die having a first set of connections, a second memory die arranged adjacent to the first memory die, the second memory die having a second set of connections, a first substrate having a first opening and a second opening, the first substrate having a third set of connections to connect to the first set of connections of the first memory die via the first opening and a fourth set of connections to connect to the second set of connections of the second memory die via the second opening, and a second substrate having a first integrated circuit disposed thereon. The first substrate is connected to the second substrate with the first integrated circuit disposed between the first substrate and second substrate.

In other features, the connections of each of the third set and the fourth set of connections are arranged in three rows at a pitch of less than or equal to 0.4 millimeters.

In other features, the first integrated circuit is a system-on-chip. The first and second memory dies are disposed on top of the first substrate. The first substrate is disposed on top of the second substrate.

In other features, the integrated circuit package further comprises a heat sink disposed on top of the first and second memory dies.

In other features, the third set of connections are connected to the first set of connections by bond wires, and the second set of connections are connected to the fourth set of connections by bond wires.

In other features, the integrated circuit package is configured to connect to connections on a printed circuit board or connections of a second integrated circuit.

In other features, the first and second memory dies are double-data-rate dynamic random access memories.

In other features, the integrated circuit package is incorporated into a computing device. The computing device includes a smartphone, a tablet, a laptop, a personal computer, a television, or a setup box.

In other features, the integrated circuit package further comprises a third memory die having a fifth set of connections, a fourth memory die arranged adjacent to the third memory die, the fourth memory die having a sixth set of connections, a third substrate having a third opening and a fourth opening, the third substrate having a seventh set of connections to connect to the fifth set of connections of the third memory die via the third opening and an eighth set of connections to connect to the sixth set of connections of the fourth memory die via the fourth opening.

In other features, the third substrate is disposed on top of the first substrate, and the first and second memory dies are disposed between the first and third substrate.

In other features, the integrated circuit package further comprises a plurality of pillars that are used to secure the third substrate on top of the first substrate and provide connections between the first and third substrates.

In other features, the third and fourth memory dies are disposed on top of the third substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

The present disclosure will become more fully understood from the detailed description and the accompanying drawings, wherein.

DESCRIPTION

Low-power (LP) double-data-rate (DDR) LP-DDR3 dynamic random access memory (DRAM) may double the bandwidth of LP-DDR2 DRAM. Most application processors cannot reach the maximum promised performance of LP-DDR2 because LP-DDR2 pin-out was derived from LP-DDR1, where originally the speed requirement was less important. An important feature, however, is the ability to stack DRAM on top of a system-on-chip (SOC) using package-on-package (POP) packaging. To stack DRAM on top of the SOC using POP packaging, the pins of the LP-DDR1 must be spread around the periphery of the package to allow the SOC to be placed directly under the center of the LP-DDR1 package. Spreading the pins, however, creates a longer signal trace relative to standard DDR2 or DDR3.

When the industry moved from LP-DDR1 to LP-DDR2, the industry did not realize that maintaining the pin-out of LP-DDR1 will aggravate the challenge of getting good signal integrity. The industry did not follow the pin-out styling of DDR3 when it moved to LP-DDR2 because standard DDR3-style packaging makes it impossible to do POP-style DRAM/SOC integration. Fundamentally, the only space available under the DDR3 is about 2 mm or so in width. Furthermore, the center of the DDR3 has a protrusion for wire bonding the DDR3 die to the DDR3 substrate. Accordingly, most SOCs cannot fit in the space available using traditional DDR3 package.

The present disclosure relates to various packaging configurations and architectures that allow stacking DRAM and an SOC in a single IC package. Additionally, the packaging systems and methods disclosed herein reduce the package size when 32-bit (x32) DDR is used and allow for using 64-bit (x64) DDR without requiring design changes.

Figure 1:
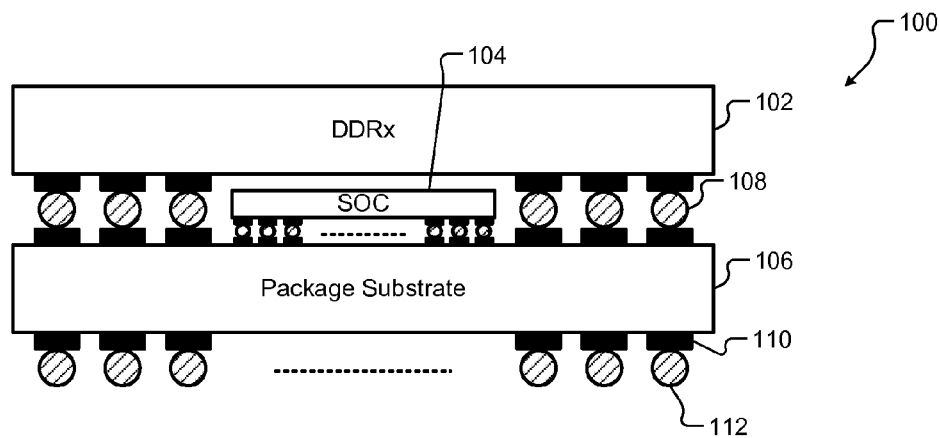
FIG. 1 depicts an integrated circuit (IC) package including a dynamic random access memory (DRAM) package arranged on top of a system-on-chip (SOC) using package-on-package (POP) technology.

Referring now to FIG. 1, an integrated circuit (IC) package 100 includes a DDRx package 102 arranged on top of a SOC 104 using package-on-package (POP) technology. The SOC 104 is arranged on a package substrate 106. The DDRx package 102 is connected to the package substrate 106 using solder balls 108. The IC package 100 can be encapsulated and arranged on a printed circuit board (PCB) or attached to another IC using bonding pads 110 and/or solder balls 112. The solder balls 108 surround the SOC 104 and limit the width and height of the SOC 104.

Figure 2:
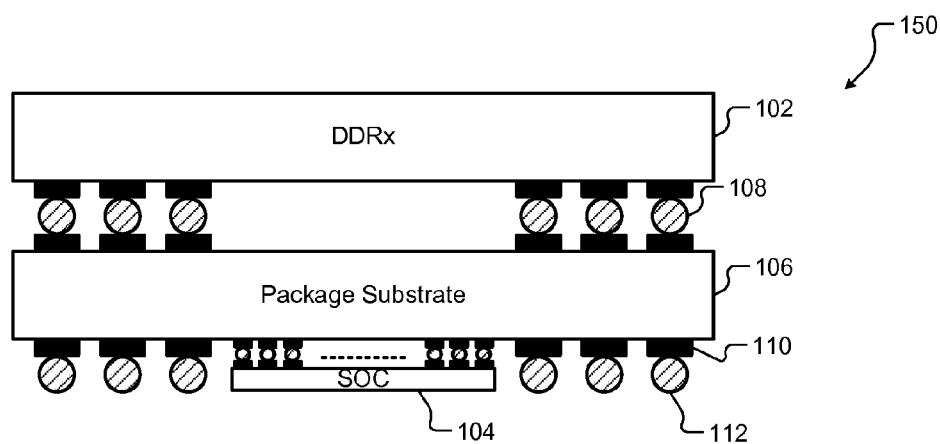
FIG. 2 depicts an IC package including a DRAM package and a SOC arranged in a flip-chip configuration on a package substrate.

Referring now to FIG. 2, an IC package 150 includes the DDRx package 102 and the SOC 104 arranged in a flip-chip configuration on the package substrate 106. While FIG. 2 shows that the package substrate 106 uses ball grid array (BGA) type packaging, any other type of packaging such as quad flat package (QFP) or quad flat no-leads (QFN) packaging may be used instead.

Figure 3A:
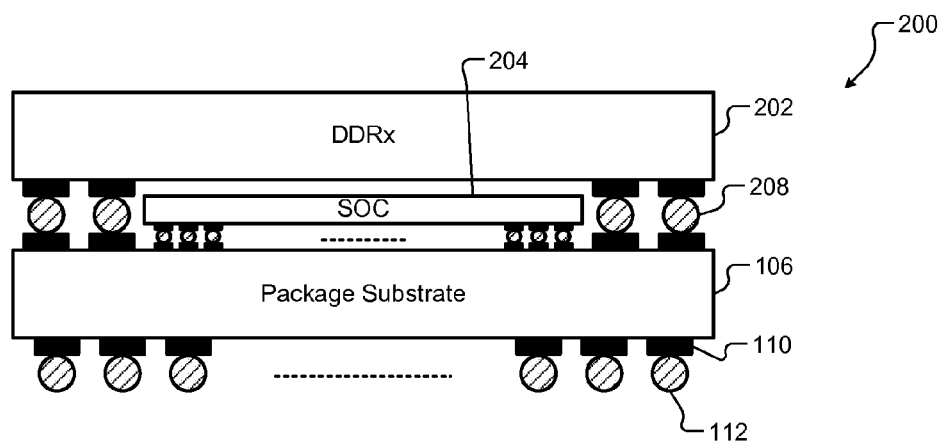
FIG. 3A depicts an IC package including a DRAM package and a SOC, where solder balls connecting the DRAM package to a package substrate are pushed towards the edges of the DRAM package.
Figure 3B:
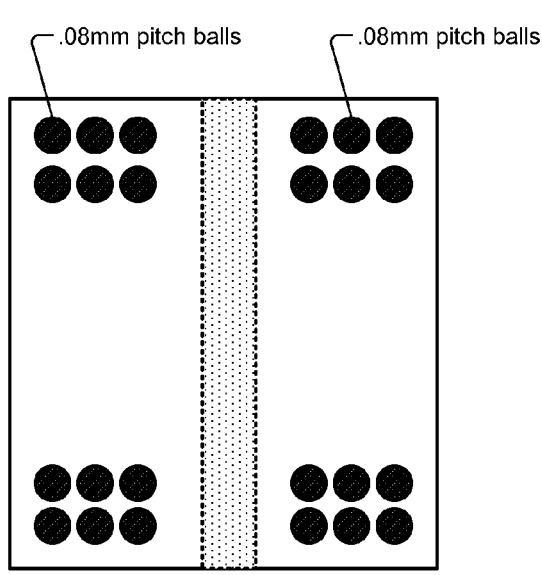
FIG. 3B depicts a DRAM package including three rows of 0.8 mm pitch balls on each side of the DRAM package.
Figure 3C:
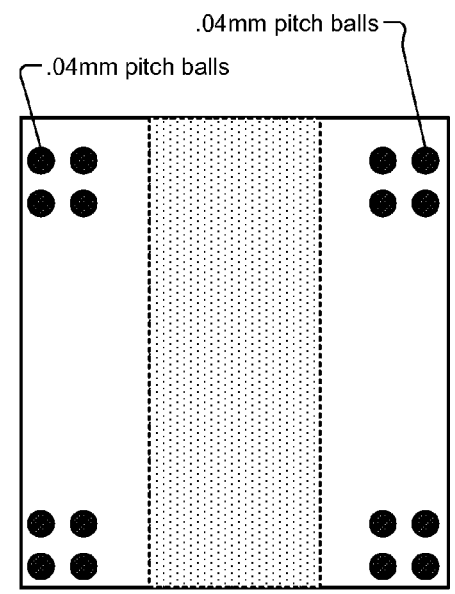
FIG. 3C a DRAM package including three rows of 0.4 mm pitch balls on a single side of the DRAM package.
Figure 3D:
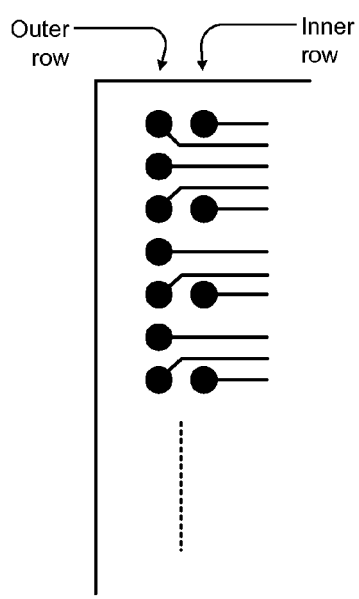
FIG. 3D depicts an arrangement of the 0.4 mm pitch balls one ball is removed for every two balls in an inner row.

Referring now to FIGS. 3A-3D, an IC package 200 includes a DDRx package 202 and a SOC 204. In FIG. 3A, balls 208 used to connect the DDRx package 202 to the package substrate 106 are pushed towards the edges of the DDRx package 202 so that the SOC 204 can be wider than the SOC 104 shown in FIGS. 1 and 2. In FIG. 3B, a standard DDRx package has three rows of 0.8 mm pitch balls on each side of the DDRx package, which leaves little space (shown dotted) for SOC. In FIG. 3C, the three rows of 0.8 mm pitch balls can be reduced to two rows of 0.4 mm pitch balls, which leaves more space (shown dotted) than that shown in FIG. 3B. Accordingly, in FIG. 3B, the balls 208 can be arranged at 0.4 mm pitch. In FIG. 3D, the balls in the inner row (row adjacent to the SOC) can be arranged farther apart than the balls in the outer row (row adjacent to the edge of the DDRx package). For example, one or more alternate balls in the inner row can be removed to allow extra space for routing connections.

Accordingly, if 0.4 mm pitch balls are used, about 30 balls can be included in a row for a 12 mm high DRAM package (i.e., about 120 balls can be included in 4 rows). One of the advantages of using this modified ball arrangement is that future high-speed mobile-class DRAM (e.g., LP-DDR3 used in mobile devices) could use the same layout topology of PC-class DRAM (e.g., DDR3) using centered I/O placement. This can provide performance similar to PC-class DRAM in a package that will be suitable for POP-mounting of mobile application processors.

Further, since 120 balls are normally unnecessary for a typical x32 wide I/O DRAM, the inner rows of balls can be arranged slightly sparser. For example, one ball for every two balls can be removed. This will result in about 20 balls for each inner row having 0.4 mm pitch. As a result, only 100 pins are necessary for a 12mm high package. This should be sufficient for x32 LP-DDR3 requirement. If insufficient, a few balls can be allocated on the top and bottom edges so long as the balls do not get close to the center of the package since the center of the package is used for opening for the wire bonding of the DRAM die to the substrate.

Figure 4A:
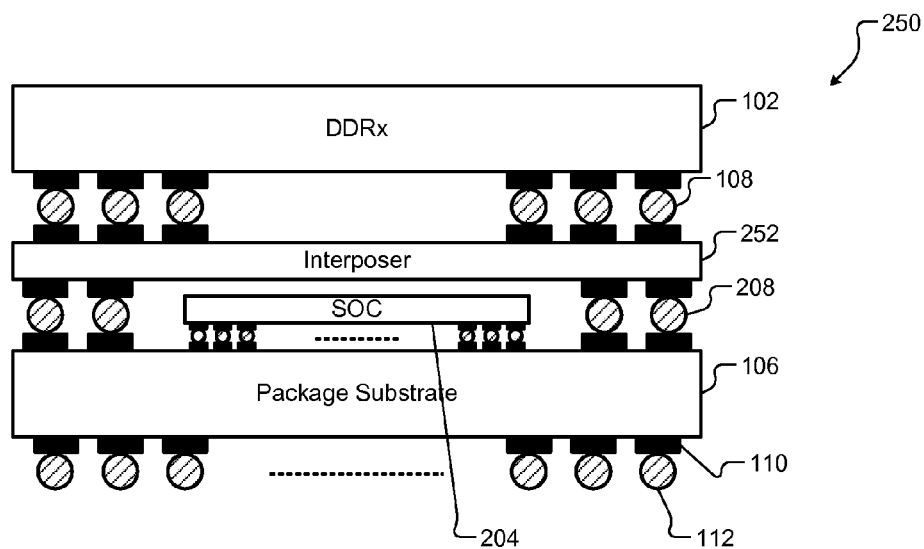
FIG. 4A depicts an IC package including an interposer arranged between a DRAM package and a package substrate with a SOC arranged on the package substrate.
Figure 4B:
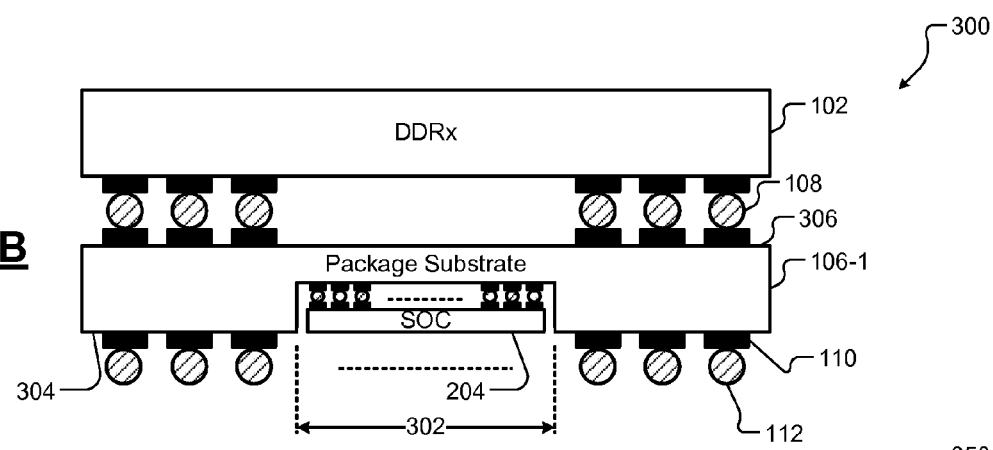
FIG. 4B depicts an IC package including a DRAM package and a SOC arranged in a flip-chip configuration in a window on a package substrate.
Figure 4C:
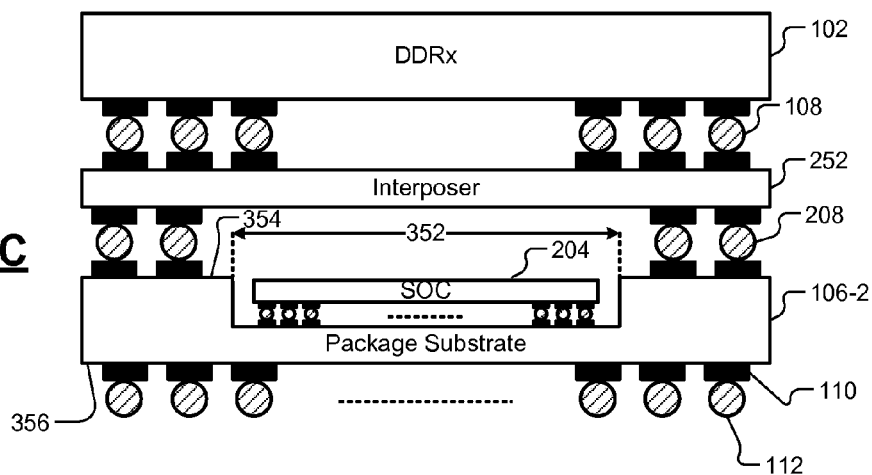
FIG. 4C depicts an IC package including an interposer arranged between a DRAM package and a package substrate with a SOC arranged in a window on the package substrate.

Referring now to FIGS. 4A-4C, an interposer may be used between the DDRx package 102 and the package substrate 106 to create additional space for the SOC 204. For example, in FIG. 4A, an IC package 250 includes an interposer 252 arranged between the DDRx package 102 and the package substrate 106. Instead of pushing the balls 108 of the DDRx package 102 out toward the edges of the IC package 250, the interposer 252 includes the balls 208 that are pushed out toward the edges of the IC package 250. Pushing the balls 208 out toward the edges of the IC package 250 creates additional space for the SOC 204. The interposer 252 provides connections between the balls 108 and the balls 208.

In FIG. 4B, instead of using an interposer, the package substrate 106 can include a window in which the SOC 204 is arranged. For example, in an IC package 300 shown, a package substrate 106-1 includes a window 302. The window 302 is arranged along a first surface 304 of the package substrate 106-1 that is opposite to a second surface 306 of the package substrate 106-1, where the first surface 304 is adjacent to the bottom of the IC package 300, and where the second surface 306 is adjacent to the DDRx package 102.

In FIG. 4C, an IC package 350 includes the interposer 252 and a package substrate 106-2. The package substrate 106-2 includes a window 352. The window 352 is arranged along a first surface 354 of the package substrate 106-2, where the first surface 354 is adjacent to the interposer 252 and opposite to a second surface 356 of the package substrate 106-2, where the second surface 356 is adjacent to the bottom of the IC package 350.

Figure 5A:
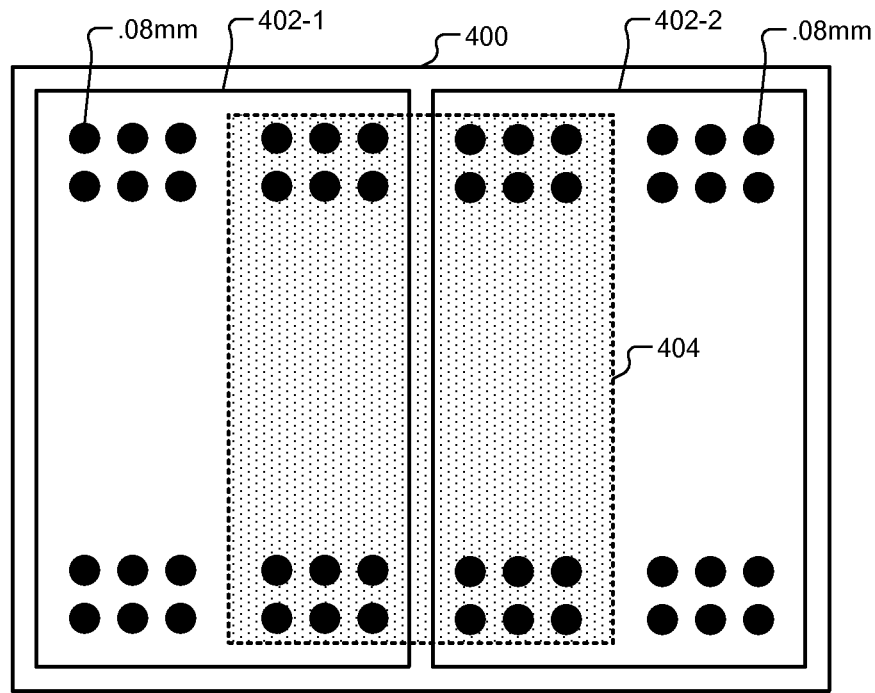
FIG. 5A depicts a plan view of an IC package including a SOC arranged on two DRAM dies.
Figure 5B:
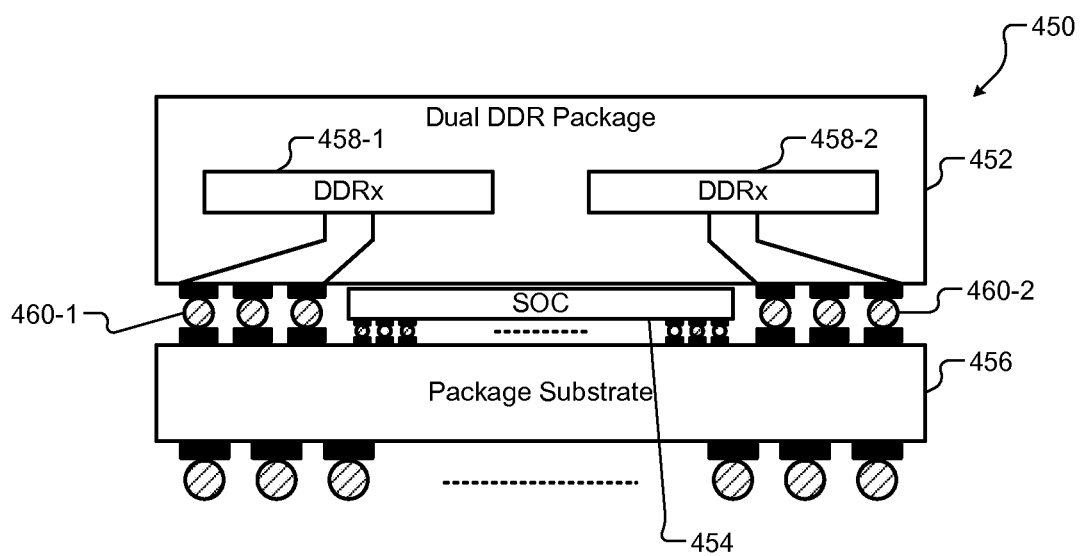
FIG. 5B depicts an IC package including a dual DRAM package stacked on top of a SOC arranged on a package substrate.

Referring now to FIGS. 5A and 5B, a dual DDRx package can be stacked on top of a SOC. Typically, in FIG. 5A, an IC package 400 includes two DRAM dies 402-1 and 402-2 and a SOC 404. The DRAM dies 402-1 and 402-2 are cut as a pair and are used as a substrate on top of which the SOC 404 is stacked. Each of the DRAM dies 402-1 and 402-2 includes three rows of 0.8 mm pitch balls on each side.

Instead, in FIG. 5B, an IC package 450 includes a dual DDRx package 452 stacked on top of a SOC 454. The SOC 454 is arranged on a package substrate 456. The dual DDRx package 452 includes two DRAM dies 458-1 and 458-2. The DRAM dies 458-1 and 458-2 can be separated before packaging. In the dual DDRx package 452, the DRAM dies 458-1 and 458-2 can be arranged closer to each other or farther apart from each other.

Each of the DRAM dies 458-1 and 458-2 includes only three rows of 0.4 mm pitch balls 460-1 and 460-2 on one side instead of three rows of 0.8 mm pitch balls on each side. Since the pitch of the balls 460-1 and 460-2 is half of the pitch of the balls shown in FIG. 5A, the number of balls in the IC package 450 can be doubled in the same amount of space. Accordingly, while the total number of balls per DRAM is the same in FIGS. 5A and 5B, the balls corresponding to a DRAM can be arranged only on one side of the IC package 450. The connections from the DRAM die 458-1 to the balls 460-1 can be arranged on the left side of the IC package 450, and the connections from the DRAM die 458-2 to the balls 460-2 can be arranged on the right side of the IC package 450. The SOC 454 can be arranged on the package substrate 456 in the space between the balls 460-1 of the DRAM 458-1 and the balls 460-2 of the DRAM die 458-2.

Figure 6:
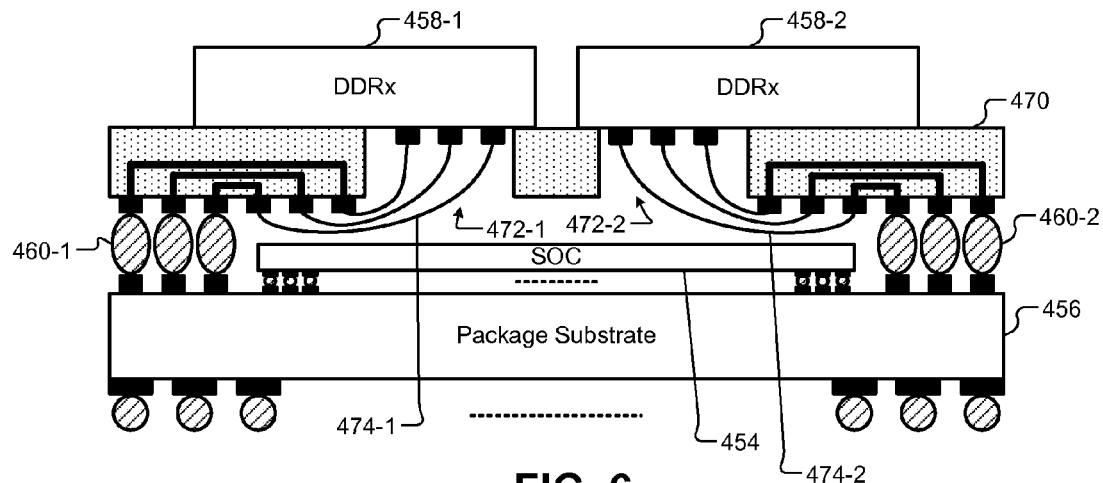
FIG. 6 depicts the IC package of FIG. 5B in detail.

Referring now to FIG. 6, the IC package 450 is shown in detail. In the dual DDRx package 452, the DRAM dies 458-1 and 458-2 are arranged on a package substrate 470. The DRAM dies 458-1 and 458-2 may be integrated in a single chip or alternatively implemented as separate chips. The package substrate 470 of the dual DDRx package 452 includes two windows 472-1 and 472-2. The window openings are not centered but instead slightly offset in such a way that the window openings are placed approximately at a quarter distance of away from the edge of the die (toward inner direction). This can be pictured as if two almost identical DDR3 dies 458-1 and 458-2 are placed next to each other in horizontal direction (assuming existing pins are placed vertically).

Bonding wires 474-1 and 474-2 respectively connect the DRAM dies 458-1 and 458-2 to the package substrate 470. This arrangement, in combination with moving the balls 460-1 and 460-2 respectively to the left and right edges of the package substrate 470 (explained above with reference to FIG. 3A), decreases wiring distances from the DRAM dies 458-1 and 458-2 to the respective balls 460-1 and 460-2. This in turn decreases inductance and parasitic capacitances on high speed signal traces, especially on data pins.

In order to get maximum possible flexibility and speed, control and address (C/A) buses can be allocated around the center of the IC package 450 while the data buses can be allocated at the outer corners of the IC package 450. Accordingly, for an x32 (i.e., 32-bit) configuration, 8 data pins can be allocated on each corner, and for an x64 (i.e., 64-bit) configuration, 16 data pins can be allocated on each corner. Further, the extra 8 pins (plus each associated control pin) for supporting the x64 configuration can be arranged at the outer most locations. This results in a smaller DRAM package for the x32 configuration while preserving forward compatibility with the x64 configuration. This allows the x32 configuration to use a smaller package to save cost.

Figure 7:
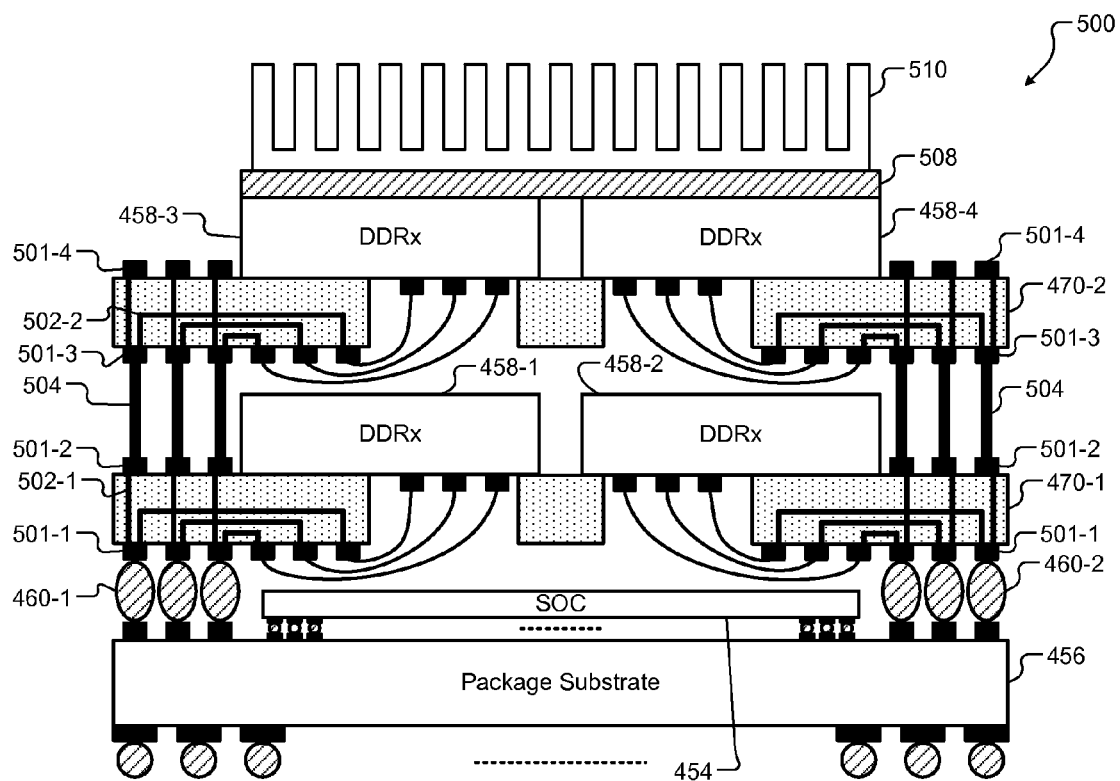
FIG. 7 depicts an IC package including a plurality of dual DRAM packages stacked on top of a SOC arranged on a package substrate and including a heat sink.

Referring now to FIG. 7, an IC package 500 including stacked DRAM dies is shown. For example, in the IC package 500, the DRAM dies 458-1 and 458-2 are arranged on a package substrate 470-1, and DRAM dies 458-3 and 458-4 are arranged on a package substrate 470-2. The DRAM dies 458-1 and 458-2 arranged on the package substrate 470-1 are stacked vertically on top of the DRAM dies 458-3 and 458-4 arranged on the package substrate 470-2. Additional DRAM dies can be stacked vertically on top of the DRAM dies 458-3 and 458-4. A heat spreader 508 is arranged on top of the DRAM dies 458-3 and 458-4. A heat sink 510 is arranged on top of the heat spreader 508.

The package substrate 470-1 includes bonding pads 501-1 and 501-2 on lower and upper surfaces of the package substrate 470-1, respectively. The balls 460-1 and 460-2 connect the bonding pads 501-1 of the package substrate 470-1 to the package substrate 456. Through-silicon vias 502-1 connect the bonding pads 501-1 to the bonding pads 501-2.

The package substrate 470-2 includes bonding pads 501-3 and 501-4 on lower and upper surfaces of the package substrate 470-2, respectively. Through-silicon vias 502-2 connect the bonding pads 501-3 to the bonding pads 501-4. Pillars 504 connect the bonding pads 501-2 of the package substrate 470-1 to the bonding pads 501-3 of the package substrate 470-2. Other types of connections such as balls may be used instead of the pillars 504.

Using the above approach with x64 (or x72) configuration, DIMM packaging can be eliminated altogether from future PC DRAM requirement. This would be extremely important as the industry moves to DDR4 speed for PC applications. Another major benefit of the above approach is that only a single DRAM in the DRAM stack is active during normal operation since each DRAM can supply all 64 signal pins. Further, the address and command pins (the C/A pins) are effectively point-to-point as far as the connection to the main CPU (in the SOC 454) is concerned, thus allowing the C/A pins to operate at a much higher clock frequency. The C/A pins can also have on-chip termination for at least one of the DRAMs in the stack (e.g., in the top of the stack) to allow very high speed operation. This will reduce power dissipation drastically. Finally, while the entire DRAM needs to be cooled for PC applications (at very high speed), only a single stack of DRAM needs to be cooled with a single heat sink 510, thus lowering heat sink cost as well.

The IC packages disclosed above may be used in a variety of computing devices including, but not limited to, a smartphone, a tablet, a laptop, a personal computer, a television, and a setup box.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

What is claimed is:

1. An integrated circuit package comprising:
   a first substrate including
   a first portion including first connections,
   a second portion including no connections,
   a third portion including second connections,
   a first opening between the first portion and the second portion, and
   a second opening between the second portion and the third portion;
   a first die arranged on the first substrate, the first die including third connections to connect to the first connections via the first opening;
   a second die arranged adjacent to the first die on the first substrate, the second die including fourth connections to connect to the second connections via the second opening;
   a second substrate connected to the first substrate; and
   a system on chip arranged on the second substrate between the first substrate and the second substrate.

2. The integrated circuit package of claim 1, wherein the first connections and the second connections are arranged in rows at a pitch of less than or equal to 0.4 millimeters.

3. The integrated circuit package of claim 1, wherein:
   the third connections are connected to the first connections by bond wires; and
   the fourth connections are connected to the second connections by bond wires.

4. The integrated circuit package of claim 1, wherein:
   the second substrate includes fifth connections and sixth connections;
   the first connections, the second connections, the fifth connections, and the sixth connections are arranged in rows at a pitch of less than or equal to 0.4 millimeters; and
   the fifth connections and the sixth connections are respectively connected to the first connections and the second connections using solder balls or pillars.

5. The integrated circuit package of claim 1, wherein the second substrate includes connections configured to connect to a printed circuit board or a second integrated circuit.

6. The integrated circuit package of claim 1, wherein:
   each of the first die and the second die includes memory; and
   the system on chip includes a system-on-chip.

7. The integrated circuit package of claim 1, wherein each of the first die and the second die includes dynamic random access memory.

8. The integrated circuit package of claim 1, wherein each of the first die and the second die includes double-data-rate dynamic random access memory.

9. The integrated circuit package of claim 1, further comprising a heat sink disposed on the first die and the second die.

10. A computing device comprising the integrated circuit package of claim 1, wherein the computing device includes a smartphone, a tablet, a laptop, a personal computer, a television, or a setup box.

11. The integrated circuit package of claim 1, further comprising:
    a third substrate including
    a fourth portion including fifth connections,
    a fifth portion including no connections,
    a sixth portion including sixth connections,
    a third opening between the fourth portion and the fifth portion, and
    a fourth opening between the fifth portion and the sixth portion;
    a third die arranged on the third substrate, the third die including seventh connections to connect to the fifth connections via the third opening; and
    a fourth die arranged adjacent to the third die on the third substrate, the fourth die including eighth connections to connect to the sixth connections via the fourth opening,
    wherein the third substrate is connected to the first substrate using pillars, and
    wherein the first substrate is connected to the second substrate using solder balls.

12. The integrated circuit package of claim 11, wherein:
    the first connections and the second connections are arranged in rows at a pitch of less than or equal to 0.4 millimeters; and
    the fifth connections and the sixth connections are arranged in rows at the pitch of less than or equal to 0.4 millimeters.

13. The integrated circuit package of claim 11, wherein:
    the third connections are connected to the first connections by bond wires;
    the fourth connections are connected to the second connections by bond wires;
    the seventh connections are connected to the fifth connections by bond wires; and
    the eighth connections are connected to the sixth connections by bond wires.

14. The integrated circuit package of claim 11, wherein:
    the second substrate includes ninth connections and tenth connections;
    the first connections, the second connections, the ninth connections, and the tenth connections are arranged in rows at a pitch of less than or equal to 0.4 millimeters;
    the ninth connections and the tenth connections are respectively connected to the first connections and the second connections using solder balls or pillars;
    the third substrate includes eleventh connections and twelfth connections;
    the eleventh connections and the twelfth connections are arranged in rows at the pitch of less than or equal to 0.4 millimeters; and
    the eleventh connections and the twelfth connections are connected to respective connections of the first substrate using pillars.

15. The integrated circuit package of claim 11, wherein the second substrate includes connections configured to connect to a printed circuit board or a second integrated circuit.

16. The integrated circuit package of claim 11, wherein:
    each of the first die, the second die, the third die, and the fourth die includes memory; and
    the system on chip includes a system-on-chip.

17. The integrated circuit package of claim 11, wherein each of the first die, the second die, the third die, and the fourth die includes dynamic random access memory.

18. The integrated circuit package of claim 11, wherein each of the first die, the second die, the third die, and the fourth die includes double-data-rate dynamic random access memory.

19. The integrated circuit package of claim 11, further comprising a heat sink disposed on the third die and the fourth die.

20. A computing device comprising the integrated circuit package of claim 11, wherein the computing device includes a smartphone, a tablet, a laptop, a personal computer, a television, or a setup box.

* * * * *